United States Patent [19]
Satou et al.

[11] Patent Number: 4,656,052
[45] Date of Patent: Apr. 7, 1987

[54] PROCESS FOR PRODUCTION OF HIGH-HARDNESS BORON NITRIDE FILM

[75] Inventors: Mamoru Satou, Kawanishi; Kohichi Yamaguchi, Kagoshima, both of Japan

[73] Assignee: Kyocera Corporation, Kyoto, Japan

[21] Appl. No.: 700,697

[22] Filed: Feb. 12, 1985

[30] Foreign Application Priority Data

Feb. 13, 1984 [JP] Japan ................... 59-23017
Feb. 29, 1984 [JP] Japan ................... 59-36137
Jul. 24, 1984 [JP] Japan ................... 59-154767
Dec. 29, 1984 [JP] Japan ................... 59-278646

[51] Int. Cl.$^4$ ............................................. B05D 3/06
[52] U.S. Cl. ................................... 427/38; 204/164
[58] Field of Search ............... 427/38, 39, DIG. 10; 204/164; 250/492.21

[56] References Cited

U.S. PATENT DOCUMENTS 2,920,002  1/1960  Auwarter .................. 427/162
3,791,852  2/1974  Bunshah .................... 427/249
4,412,899  11/1983 Beale ......................... 427/38
4,540,596  9/1985  Nimmasadda ............. 427/39

Primary Examiner—John H. Newsome
Attorney, Agent, or Firm—Spensley Horn Jubas & Lubitz

[57] ABSTRACT

In a process for the production of a high-hardness boron nitride film by vacuum-depositing a boron component on a substrate from a boron-containing vacuum deposition source and simultaneously irradiating the substrate with an ion seed comprising at least nitrogen from an ion-generating source, if the atomic ratio (B/N) between boron and nitrogen supplied from the vacuum deposition source and the ion seed is adjusted within a range of from 4 to 25, the ion acceleration energy of the ion seed is adjusted to 5 to 100 KeV per atom of the ion seed and vacuum deposition and irradiation are carried out in an atmosphere of a nitrogen atom or nitrogen compound activated at an energy level lower than that of the ion seed, the hardness and quality of the film are highly improved. Furthermore, if a negative bias voltage is applied to the substrate at the vacuum deposition and irradiation with the seed ion, the film-forming speed can be increased and the hardness and quality of the film are further improved.

21 Claims, 6 Drawing Figures

PROCESS FOR PRODUCTION OF HIGH-HARDNESS BORON NITRIDE FILM

BACKGROUND OF THE INVENTION (1) Field of the Invention

The present invention relates to a process for the production of a high-hardness boron nitride film. More particularly, the present invention relates to a process for preparing a high-hardness boron nitride film by the vacuum deposition method and ion irradiation method (boron nitride will be referred to as "BN" hereinafter).

(2) Description of the Prior Art

BN includes crystal structures of cubic boron nitride (hereinafter referred to as "CBN"), hexagonal closest packing boron nitride (hereinafter referred to as "WBN") and hexagonal boron nitride (hereinafter referred to as "HBN"). Of these crystal structures, CBN and WBN are excellent in the heat shock resistance, heat conductivity, hardness and abrasion resistance and also in resistance to a metal of the iron group at high temperatures. Accordingly, application of CBN and WBN to various uses has attracted attention and investigations have been made concerning the production of high-hardness boron nitride composed mainly of CBN or WBN which has a high quality.

As one conventional production technique, a method exists in which synthesis of high-hardness boron nitride is carried out under such high pressure and temperature conditions as scores of thousands of atmospheres and one thousand and several hundreds of °C. by using an expensive apparatus. Recently, studies have been made on a method in which a film of high-hardness boron nitride composed mainly CBN or WBN is formed on the surface of a substrate at a high efficiency by the gas phase growth process.

The film-forming techniques are roughly divided into the chemical deposition method and the physical deposition methods. In the field of the production of BN films, the physical deposition methods using ions are mainly investigated. These physical deposition methods include an ion beam deposition method in which an ionized atom is accelerated and is then decelerated and deposited on a substrate, a cluster ion plating method in which a cluster ion is accelerated and caused to impinge against a substrate and a large quantiy of atoms are deposited on the substrate at a time, and an in beam sputtering method in which an ionized and accelerated atom sputtered by a rare-gas or the like is deposited on a substrate. In this lost method, the kinetic energy of the ion is several eV to several hundreds of eV and the seed is barely implanted into the interior of the substrate, and therefore, the adhesion between the film and substrate is insufficient.

As another known method of producing high-hardness boron nitride, there exists an ion mixing method. According to this method, a certain substance is vacuum-depositioned on a substrate and the deposited film is irradiated with an ion seed such as a rare-gas with a kinetic energy of at least several hundreds of KeV. By such irradiation the atom of the vacuum-deposited substance is bounced by impingment of the ion seed and is caused to intrude into the interior of the substrate and a new film composed of components of both the substrate. Thereby the vacuum-deposited layer is formed between the substrate and the vacuum-deposited layer. Then, the remaining vacuum-deposited film is removed by chemical means to form a new film on the surface of the substrate. In this method, even if the energy of the ion seed becomes large, the ion current need not be increased, and large quantities of different atoms can be implanted in the vicinity of the surface of the substrate. However, this method is still insufficient in that it is difficult to maintain a constant mixing ratio between the implanted ions and the constituent atoms of the substrate.

As is seen from the foregoing description, even according to the above-mentioned film-forming techniques using ions, films of high-hardness boron nitride composed mainly of CBN or WBN have not been synthesized.

SUMMARY OF THE INVENTION

Proceeding from the above-mentioned background, research was performed, and as a result, it was found that when vacuum deposition and ion irradiation are carried out on a substrate by using a boron-containing vacuum deposition source and an ion-generating source for generating an ion seed comprising at least nitrogen, then a film of high-hardness boron nitride composed mainly of CBN or WBN, which has a good quality, can be obtained. The present invention is based on this finding.

It is therefore a primary object of the present invention to provide a novel process for the production of a high-hardness BN film. Particularly, a high-quality film of high-hardness boron nitride composed mainly of CBN or WBN is formed on a substrate.

Another object of the present invention is to provide a process in which a high-quality film of high-hardness boron nitride composed mainly of CBN or WBN is formed on a substrate at a high film-forming speed.

Still another object of the present invention is to provide a process in which a high-quality boron nitride film is formed on a substrate at a high energy efficiency.

In accordance with one fundamental aspect of the present invention, there is provided a process for the production of a high-hardness boron nitride film. This process comprises vacuum-depositing a boron component on a substrate from a boron-containing vacuum deposition source and simultaneously irradiating the substrate with an ion seed comprising at least nitrogen from an ion-generating source for generating said ion seed in order to therein form boron nitride on the substrate. The atomic ratio (B/N) between boron and nitrogen supplied from the vacuum deposition source and the ion seed is adjusted within a range of from 4 to 25, the ion acceleration energy of the ion seed is adjusted to 5 to 100 KeV per atom of the ion seed, and vacuum deposition and irradiation are carried out in an atmosphere of a nitrogen atom or nitrogen compound activated at an energy level lower than that of the ion seed.

In accordance with the present invention, there is further provided a process as set forth above, wherein activated boron is vacuum-deposited on the substrate by (i) supplying a boron-containing gas to an arc discharge region and/or (ii) forming an arc discharge region by using a boron-containing substance as an arc discharge electrode material.

In accordance with another fundamental aspect of the present invention, there is provided a variant process for the production of a high-hardness BN film. This variant process comprises vacuum-depositing a boron component on a substrate form a boron-containing vacuum deposition source and simultaneously irradiating the substrate with an ion seed comprising at least nitrogen from an ion-generating source for generating said in seed, therein forming BN on the substrate. The ion acceleration energy of the ion seed is adjusted to 5 to 100 KeV per atom of the ion seed, the deposition and irradiation are carried out in an atmosphere of a nitrogen atom or nitrogen compound activated at an energy level lower than that of the ion seed, and simultaneously, a negative bias voltage is applied to the substrate.

Moreover, in accordance with the present invention, there is provided a process as set forth above, wherein the total concentration of the oxygen and carbon atoms in the atmosphere adopted for vacuum deposition and irradiation is controlled below 100 ppm.

DETAILED DESCRIPTION OF THE PREFERRED EMBODIMENTS

First Embodiment

In the present invention, high-hardness boron nitride composed mainly of CBN or WBN is synthesized by vacuum-depositing a boron component on a substrate from a boron-containing vacuum deposition source, and by simultaneously irradiating the substrate with an ion seed comprising at least nitrogen from an ion-generating source for generating said ion seed. Furthermore, the thickness of the high-hardness BN film can be increased by first vacuum-depositing the boron component on the substrate and by then irradiating the substrate with the above-mentioned ion seed to form high-hardness boron nitride composed mainly of CBN or WBN, and by repeating formation of the vacuum deposition film and irradiation with the ion seed alternately.

According to the present invention, simultaneously with or after formation of the vacuum-deposited boron film—because of the implantation and recoil effect of the implanted nitrogen atom and the thermal effect of the energy generated when the ion becomes stationary in the film—a highly exciting state resembling the state produced by scores of thousands of atmospheres and one thousand and several hundreds of °C. is produced instantaneously and locally, and $SP^3$ hybrid orbits of boron and nitrogen atoms, indispensable for formation of CBN or WBN, are formed. Based on this phenomenon, $SP^3$ coupling is caused between these boron and nitrogen atoms and they act as crystal nuclei for CBN or WBN, and high-hardness boron nitride composed mainly of CBN or WBN is thus formed.

As the boron-containing vacuum deposition source, there can be used at least one member selected from metallic boron and boron compounds such as boron sulfide, phosphorus boride, hydrogen boride, aluminum-containing or magnesium-containing metal borides and transition metal borides.

Any of ion seeds having a predetermined ion acceleration energy and being capable of reacting with a boron-containing vacuum deposition source to form a film of high-hardness boron nitride composed mainly of CBN or WBN can be used as the ion seed. More specifically, at least one member selected from a nitrogen atom ion ($N^+$), a nitrogen molecule ion ($N_2^+$), a nitrogen compound ion such as an ammonium ion ($NH_3^+$), a boron compound ion such as a boron nitride ion ($BN^+$) and an inert gas ion such as $Ar^+$ is preferably used as the ion seed. Furthermore, $B_3N_3H_6$ or $Al_2B_2N_4$ may be ionized and used as the ion seed. Moreover, an ion seed such as a boron ion ($B^+$) or a hydrogen boride ion ($B_2H_6^+$) may be used in combination with the above-mentioned nitrogen-containing ion seed.

An ion seed as described above is produced by an apparatus described below, is magnetically selected by using a magnetron for the mass analysis according to need and is then supplied to the surface of the substrate.

The material of the substrate is not particularly critical, and ceramics, cemented carbides, cermets, and various metals and alloys may be used. However, if the substrate is formed of an electrically insulating material, the properties of the vacuum-deposited film differ between a charged part and a non-charged part, and deviation of the characteristics is readily caused. Accordingly, it is preferred that an electric conductor be used as the substrate. Of course, however, an electrically insulating substrate may be used if a film of an electric conductor is formed on the surface according to a customary method.

In one embodiment of the present invention, it is important that the atomic ratio (B/N) in the boron and nitrogen atoms supplied from the vacuum deposition source and ion seed should be adjusted within a range of from 4 to 25 and the ion acceleration energy of the ion seed should be 5 to 100 KeV per atom of the ion seed.

If this atomic ratio B/N is lower than 4, BN in the amorphous state is readily formed, and if the atomic ratio B/N exceeds 25, boron becomes excessive and boron in the amorphous state is readily formed in the film.

From the results of experiments made by us, it has been confirmed that best results can be obtained if the atomic ratio B/N is within a range of from 5 to 18.

If the ion acceleration energy of the ion seed is smaller than 5 KeV, the amount of the ion seed implanted in the vacuum-deposited film is decreased and the sputtering phenomenon becomes dominant, and if the ion acceleration energy of the ion seed exceeds 100 KeV, since the ion seed is implanted deeply beyond the vacuum-deposited layer formed on the surface of the substrate, high-hardness BN composed mainly of CBN or WBN is hardly formed and moreover, since the temperature of the vacuum-deposited layer becomes too high, formation of HBN becomes dominant while high-hardness BN composed mainly of CBN or WBN is hardly formed.

In the present invention, sicne the atomic ratio B/N is 4 to 25 and boron is extremely excessive, it also is important that the vacuum deposition and ion seed irradiation treatments should be carried out in an atmosphere of a nitrogen atom or nitrogen compound activated at an energy level lower than that of the ion seed. Namely, the present invention is based on the novel finding that under conditions where a boron-containing vacuum evaporation source and a high-energy nitrogen-containing ion seed are copresent, even a nitrogen atom activated at a level lower than that of the ion seed participates in formation of high-hardness boron nitride composed mainly of CBN and/or WBN.

As pointed out hereinbefore, the ion seed used in the ion and vapor deposition process (IVD method) of the present invention has such a high energy as 5 to 100 KeV per atom of the ion seed. On the other hand, the kinetic energy of the ion used in the conventional film-forming technique such as the ion beam deposition method, the cluster ion plating method or the ion beam sputtering method is much lower than in the ion and vapor deposition method and is in the order of several eV to several hundreds of eV.

In the present invention, by making a nitrogen atom or nitrogen compound, which is excited at a low level, present in the ion and vapor deposition atmosphere, the state where the nitrogen atom is extremely defined in the vacuum deposition source and ion seed is compensated and a BN film having a good quality is obtained.

Moreover, according to the present invention, as is apparent from the results of Examples given hereinafter, by adjusting the atomic ratio B/N within a range of from 4 to 25, a BN film having a very high quality can be obtained, and by supplement of the nitrogen atom from the atmosphere, the film-forming speed per unit time is extremely increased, as shown in Examples given hereinafter. Furthermore, by utilizing the ion seed irradiation mainly for attainment of the implantation and recoil effect and the thermal effect and supplying the reactants as an atmosphere excited at a low energy level, the energy efficiency for formation of the film is prominently improved.

Various means may be adopted for forming a nitrogen or nitrogen compound atmosphere excited at a low energy level in the vicinity of the surface of the substrate in the present invention. Simplest means comprises supplying a nitrogen atom or nitrogen compound activated at a low energy level to the surface of the substrate together with a high-energy ion seed form the above-mentioned ion-generating source. Another means comprises causing arc discharge in a current of a nitrogen gas or nitrogen compound to form a nitrogen atom or nitrogen compound activated at a low energy level and introducing the nitrogen atom or nitrogen compound into the vacuum deposition and irradiation zone.

In the present invention, it also is important that the ion acceleration energy should be set within the above-mentioned predetermined range and simultaneously, the dose rate (the ion current per unit area) of the ion seed should be set so that the quantity of heat generated in the substrate by irradiation with the ion seed is 0.01 to 20 W per unit area ($cm^2$). If this heat quantity exceeds 20 W/$cm^2$, the temperature of the boron vacuum-deposited layer becomes too high, formation of HBN becomes dominant while high-hardness BN composed mainly of CBN or WBN is hardly formed. If the quantity of heat is smaller than 0.01 W/$cm^2$, the implantation and recoil effect or thermal effect cannot be attained by the ion seed and high-hardness boron nitride composed mainly of CBN or WBN is hardly synthesized.

In the present invention, it is preferred that the temperature of the substrate be set at $-200°$ to 700° C.

If the substrate temperature is set at $-200°$ to 700° C., the highly excited state formed locally and instantaneously can be easily maintained, and formed CBN or WBN can be frozen so that it is not converted to HBN. If the substrate temperature is lower than $-200°$ C., the BN film formed on the surface of the substrate is readily peeled, and if the substrate temperature exceeds 700° C., conversion of formed CBN or WBN to HBN is readily caused. From the results of experiments made by us, it has been confirmed that best results can be obtained when the substrate temperature is 0° to 400° C.

An apparatus for the production of a high-hardness BN film according to the present invention will now be described with reference to FIG. 1.

A gas to be ionized, for example, $N_2$, is introduced into an ion source 2 through a leak valve 1, and the gas is ionized in the ion source 2 and is accelerated by an accelerator 3 to impart a predetermined ion acceleration energy. The ion is then introduced into an analyzing magnet 4, and only the necessary ion seed is magnetically selected in the analyzing magnet 4 and is supplied to a reaction chamber 5.

A high vacuum less than $10^{-4}$ Torr is maintained in the reaction chamber 5 by a vacuum pump 6 (for example, a turbo molecule pump). A substrate 7 is secured to a substrate holder 8 and irradiated with the above-mentioned ion seed. In order to uniformly irradiate the substrate with the ion seed, the ion seed is passed through a convergent lens 9.

A vacuum deposition device 10 is arranged below the substrate 7, and an appropriate heating method such as electron beam heating or laser heating may be adopted in this device 10. A boron-containing vacuum deposition source is contained in the device 10. The vacuum-deposited amount and vacuum deposition speed of the boron-containing vacuum deposition source may be measured by, for example, an oscillating type film thickness meter 11 using a quartz plate, which is arranged beside the substrate holder 8.

The number of atoms of the ion seed, that is, the ion current, can be measured precisely by a current integrating meter 13 provided with a secondary electron emission electrode 12.

In order to form an atmosphere of a nitrogen atom activated at a low energy level, an arc discharge chamber 14 is diposed, $N_2$ gas is supplied in this discharge chamber and nitrogen atoms excited by differential evacuation are introduced into the reaction chamber 5.

In the above-mentioned apparatus, the substrate 7 is set at a predetermined position and a predetermined vacuum degree is maintained in the reaction chamber 5, and the vacuum deposition device 10 is actuated to a predetermined amount vacuum deposition from the boron-containing vacuum deposition source on the substrate 7. If the substrate 7 is irradiated with the predetermined ion seed at a predetermined ion acceleration energy, a film of high-hardness BN composed mainly of CBN and WBN is formed on the surface of the substrate 7.

Incidentally, since either vacuum deposition of the boron-containing vacuum deposition source or irradiation with the ion source is effected only from one direction of the substrate, in the case where a high-hardness BN film composed mainly of CBN and WBN is formed on the entire surface of the substrate, it is necessary to give such a motion as rotation or swinging to the substrate.

Second Embodiment

According to the second embodiment of the present invention, in the above-mentioned film production process, activated boron is vacuum-deposited by supplying a boron-containing gas to an arc discharge region and/or forming an arc discharge region by using an arc discharge electrode.

It is considered that according to this embodiment of the present invention, the ion seed of nitrogen will be relatively easily activated to a high energy level of $SP^3$ hybrid orbits on the substrate. Accordingly, the other atom, that is, boron, is activated by supplying a boron-containing gas or substance to an arc discharge region. More specifically, at this arc discharge, the boron atom is sputtered by an electron and an ion and a part of boron is ionized. This boron ion gains an activated energy state and is vacuum-deposited on the substrate, and therefore, $SP^3$ coupling is readily caused with the nitrogen atom.

In the present invention, when a nitrogen gas or nitrogen compound gas is supplied into the arc discharge region, a nitrogen ion is generated by the discharge and causes chemical reaction with a boron-containing gas or sputters boron of the arc discharge electrode. Accordingly, an intermediate product composed of boron and nitrogen can be vacuum-deposited on the substrate. From the results of experiments made by us, it has been confirmed that the speed of formation of a BN film can be prominently increased by formation of this intermediate product.

Furthermore, if an apparatus of FIG. 2, described hereinafter, is employed, since the arc discharge region is located at a portion through which the ion seed of nitrogen passes, the above-mentioned intermediate product of boron and nitrogen is easily formed and the speed of formation of a BN film is prominently increased.

Moreover, as described hereinafter, the nitrogen ion generated by the arc discharge can be used for formation of a nitrogen atmosphere activated at a low energy level.

As the boron-containing gas, there can be used, for example, $B_2H_6$, $B_{10}H_{14}$ and borazol.

As the boron-containing substance, there can be used at least one member selected from metallic boron and boron compounds such as boron sulfide, phophorus boride, hydrogen boride, aluminum-containing and magnesium-containing metal borides and transition metal borides.

Other conditions are substantially the same as those of the first embodiment.

The second embodiment of the present invention will now be described with reference to FIG. 2. The apparatus shown in FIG. 2 is the same as the apparatus shown in FIG. 1 except the apparatus of FIG. 2 is provided with an arc discharge mechanism, and common members and parts are indicated by the same reference numerals as used in FIG. 1.

Figure 2:
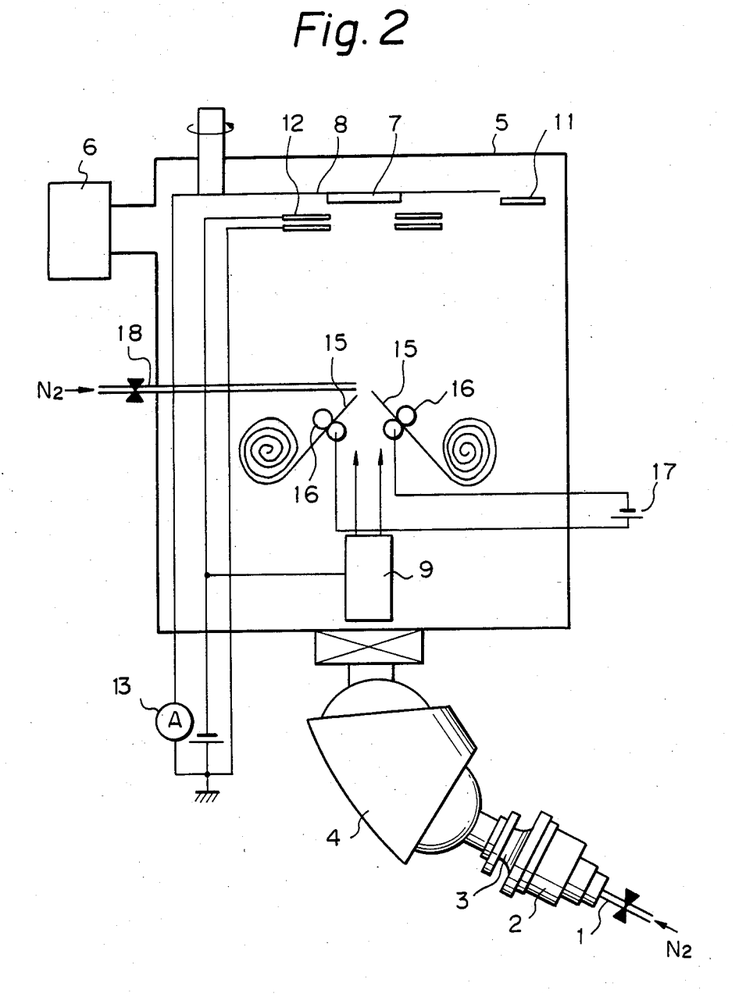
FIG. 2 is view showing another example of the BN film-producing apparatus for use in carrying out the process of the present invention, where an arc discharge double electrode is disposed.

Referring to FIG. 2, reference numeral 15 represents a double electrode composed of a linear boron-containing substance would by a reel (not shown). The double electrode 15 is located at a predetermined position by a roll 16. This roll 16 is connected to an arc discharge power source 17. A jet opening of an introduction tube 18 is located in the vicinity of the top end of the arc discharge double electrode 15 to introduce a nitrogen gas into an arc discharge region.

In the above-mentioned apparatus, the substrate 7 is set at a predetermined position and a predetermined vacuum degree is maintained in the reaction chamber 5, and a nitrogen gas is introduced through the introduction tube and arc discharge is caused between the double electrodes 15, 15 by the arc discharge power source 17 to form a nitrogen-cotaining boron ion. A predetermined amount of this ion is vacuum-deposited on the substrate 7. If the substrate is irradiated in this state with a predetermined ion seed at a predetermined ion acceleration energy, a film of high-hardness BN composed mainly of CBN and WBN is formed on the surface of the substrate.

According to this production process of the present invention, since boron is vacuum-deposited on the substrate by the arc discharge, the hourly supply rate of boron can be controlled by controlling the arc discharge power source or adjusting the distance between the double electrodes 15, 15. Accordingly, a desired film-forming speed can be obtained by adjusting the supply rate of boron while adjusting the irradiation quantity of the nitrogen ion.

Moreover, since the linear arc discharge electrode material acting as the boron supply source is wound by the reel, even if the top end portion of the electrode is consumed by the arc discharge, the electrode can be supplied in succession and a high-quality BN film can be continuously formed on the substrate over a long period. Moreover, vacuum deposition on a substrate having a large area to be covered can be conveniently accomplished and the film thickness can be increased.

In the apparatus shown in FIG. 2, an arc discharge electrode is disposed as the boron supply source. Instead of this method, there may be adopted a method in which a boron-containing gas such as $B_2H_6$, $B_5H_9$, $B_{10}H_{14}$ or borazol gas is supplied as the boron supply source into the arc discharge region through the introduction tube 18. These methods may be adopted singly or in combination.

Third Embodiment

According to the third embodiment of the present invention, the above-mentioned vacuum deposition and irradiation are carried out in a state where a negative bias voltage is applied to the substrate.

This embodiment is based on the novel finding that an atmosphere of a nitrogen atom or nitrogen compound activated at a low energy level is positively charged as a whole. As is shown in Examples given hereinafter, if a negative bias voltage is applied to the substrate, the positively charged atmosphere is attracted to the substrate and the nitrogen component is positively implanted in the surface of the substrate. Thus, the atmosphere makes an effective contribution to formation of a BN film.

A component to be ionized at the vacuum deposition and ion irradiation is produced in the boron component emitted from the vacuum deposition source by application of the negative bias voltage, and this component is accelerated and attracted to the surface of the substrate to effectively promote formation of a BN film.

Moreover, since the ion seed generated from the ion-generating source is scattered by the ion irradiation, and a part of the scattered ion seed becomes extinct without participating in formation of a BN film, but according to the present invention, the scattered ion seed is attracted to the substrate and fruitless ion irradiation can be avoided.

From the results of experiments made by us, it has been confirmed that best results are obtained when the bias voltage to be applied to the substrate is set at $-100$ V to $-10$ V, though the optimum bias voltage changes to some extent according to the ion acceleration energy of the negative ion seed.

By this application of the bias voltage, supplement of the nitrogen atom from the atmosphere can be advanced more effectively, and the film-forming speed per unit time can be further increased. Moreover, by efficiently supplying reactants as an atmosphere excited at a low energy level by mainly utilizing the implantation and recoil effect and the thermal effect for irradiation with the ion seed, the energy efficiency for formation of the film can be prominently improved. Attainment of these advantages has been experimentally confirmed.

In this third embodiment of the present invention, if the atomic ratio (B/N) in boron and nitrogen atoms supplied from the vacuum deposition source and the ion seed is adjusted within a range of from 0.2 to 10, formation of a high-hardness BN film can be greatly facilitated.

If the atomic ratio B/N is lower than 0.2, amorphous BN is readily formed, and if the atomic ratio B/N exceeds 10, amorphous boron is readily formed in the film. From the results of experiments made by us, it has been confirmed that best results can be obtained when the atomic ratio B/N is adjusted within a range of from 0.5 to 5.

Other conditions in the third embodiment are substantially the same as in the first embodiment.

An apparatus for use in carrying out this embodiment will now be described with reference to FIG. 3. The apparatus of FIG. 3 is the same as the apparatus shown in FIG. 1 except that mechanism for apply a bias voltage to the substrate is disposed in the apparatus of FIG. 3.

Figure 3:
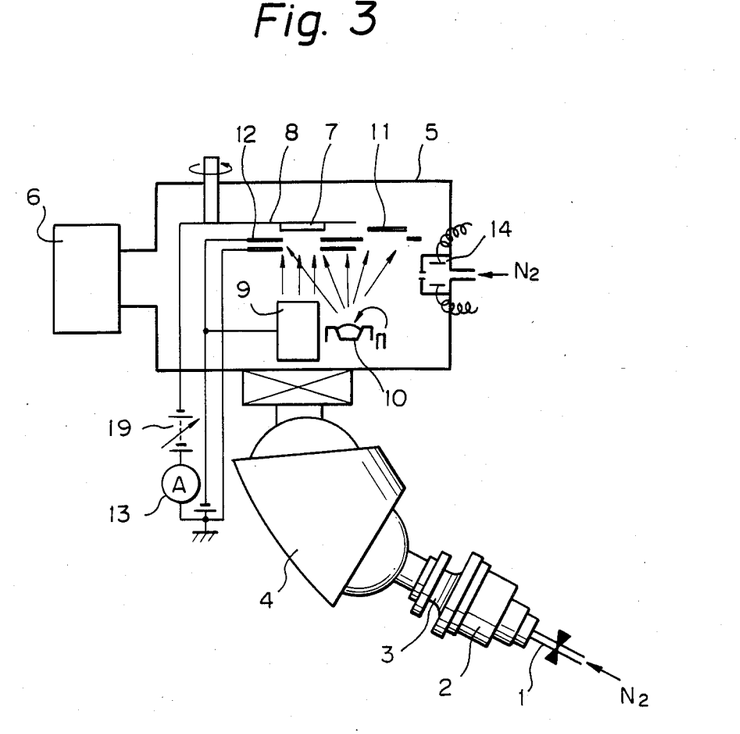
FIG. 3 is view showing still another example of the BN film-producing apparatus for use in carrying out the process of the present invention, where a mechanism for applying a negative bias voltage to a substrate is disposed.

In the apparatus shown in FIG. 3, a voltage-adjustable bias power source 19 is connected between a substrate 7 and a secondary electron emission electrode 12 so that a negative bias voltage is applied to the substrate 7.

In this apparatus, the substrate 7 is set at a predetermined position, a predetermined vacuum degree is maintained in a reaction chamber, a vacuum deposition device 10 is actuated to a predetermined amount vacuum deposition from a boron-containing vacuum deposition source, the substrate is irradiated with a predetermined ion seed at a predetermined ion acceleration energy, and simultaneously, a predetermined negative bias voltage is applied to the substrate 7 from the power source 19, whereby a film of high-hardness BN composed mainly of CBN and WBN is formed on the surface of the substrate.

Fourth Embodiment

According to the fourth embodiment, in each of the above-mentioned processes, the total concentration of oxygen and carbon atoms in the atmosphere for the vacuum deposition and irradiation is controlled below 100 ppm.

In the present invention, as pointed out hereinbefore, the vacuum deposition and ion seed irradiation treatments are carried out in an atmosphere of a nitrogen atom or nitrogen compound activated to a lower energy level than the ion seed. It is preferred that the amount of oxygen or carbon atoms considered to be inevitably present in this atmosphere be controlled. Namely, the fourth embodiment of the present invention is based on the novel finding that in the system of reaction of forming CBN or WBN, an oxygen or carbon atom acts as an inhibitor factor.

Reaction is caused very easily between a boron atom and an oxygen atom, and if an oxygen atom is present in the reaction system of the ion and vapor deposition process of the present invention, a part of the boron atom couples with the oxygen atom to form boron oxide, which inhibits the gas phase growth of CBN or WBN or promotes inclusion of boron oxide in the grain boundary of CBN or WBN, with the result that the stability of the film is generated and a high-quality film cannot be obtained.

Similarly, a carbon atom is very liable to react with a boron atom and inhibits the gas phase growth of CBN or WBN, and the carbon atom is included as boron carbide to render the production of a high-quality film impossible.

In the present invention, if the atomic ratio B/N in the boron and nitrogen atoms supplied from the vacuum deposition source and ion seed is adjusted to 4 to 25 when a negative bias voltage is not applied or to 0.2 to 10 when a negative bias voltage is applied, a high-hardness BN film can be easily formed.

In order to control the concentration of the oxygen and carbon atoms in the reaction chamber to the above-mentioned level, there may be adopted means of using refined starting boron and nitrogen materials in which the amount of incorporated oxygen or carbon atoms is extremely small and increasing the vacuum degree in the reaction chamber.

The present invention will now be described in detail with reference to the following examples that by no means limit the scope of the invention.

EXAMPLE 1

Figure 1:
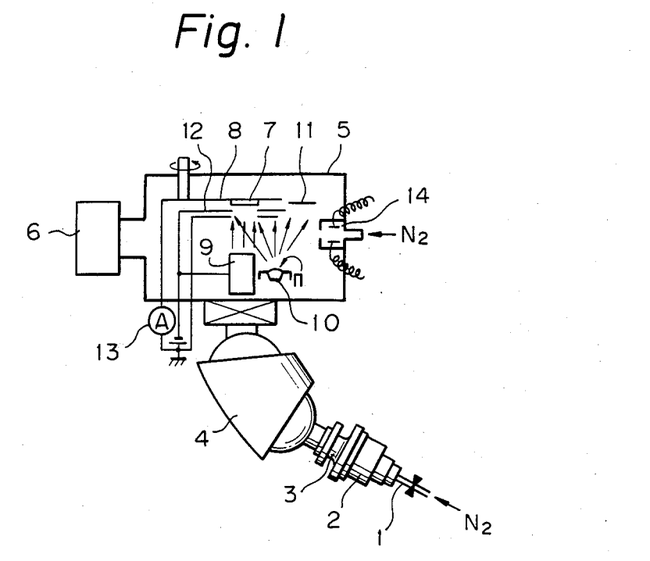
FIG. 1 is view showing an example of the BN film-producing apparatus for use in carrying out the process of the present invention.

High-purity $N_2$ gas was introduced into a PIG type ion source 2 from a leak valve 1 in the apparatus shown in FIG. 1.

Various acceleration energies were given to generated ions by an accelerator 3, and the ion beams were subjected to the mass analysis in an analyzing magnet 4 to magnetically select $N_2^+$ alone.

A silicon plate was used as the substrate and was set on a substrate holder 8, and a reaction chamber 5 was evacuated by a turbo molecule pump having a capacity of 650 l/sec.

An electron beam vacuum deposition device 10 in which metallic boron was contained was actuated to evapolate metallic boron, and boron was vacuum-deposited on the silicon plate 7 while simultaneously irradiating the substrate 7 with $N_2^+$ ions. When the gas in the reaction chamber 5 was analyzed, it was found that an activated nitrogen gas atmosphere was produced in the reaction chamber 5.

The vacuum-deposited amount and vacuum deposition speed of B were measured by an oscilating type thickness meter 11 and the number of $N_2^+$ ions was measured by a current integrating meter 13, and the atomic ratio B/N was calculated. Formation of the film was carried out by changing the amount deposited of B by changing the ion acceleration energy for $N_2^+$ ions.

A BN film having a thickness of 2 μm was formed by continuing the operation for 2 hours under such conditions that the $N_2^+$ ion acceleration energy was 35 KeV (corresponding to the acceleration energy of 17.5 KeV per atom of the ion seed), the atomic ratio B/N was 10 and the vacuum degree was $0.8 \times 10^{-5}$ Torr.

When the obtained BN film was analyzed by X-ray diffractometry, peaks attributed to CBN (111) and WBN (002) were observed, and the presence of CBN and WBN was confirmed.

EXAMPLE 2

BN films were prepared in the same manner as described in Example 1 except that the atomic ratio B/N and the dose rate were changed as indicated in Table 1. The obtained results are shown in Table 1.

From the results shown in Table 1, it is seen that if the atomic ratio B/N exceeds 25, the electric resistance and hardness are reduced, and that if the atomic ratio B/N is lower than 4, formation of HBN becomes conspicuous and the hardness is reduced.

Moreover, from the results of Runs Nos. 8 through 11, it is seen that there is an optimum range for the dose rate (W/cm²), and that if the dose rate is too low and below this range, no substantial efect is attained by the ion irradiation and if the dose rate is too high, the quantity of generated heat is increased and formation of HBN becomes conspicuous to reduce the hardness. It also is seen that by adjusting the atomic ratio B/N to 4 or higher the film-forming speed is extremely increased.

TABLE 2

| Substrate Temperature (°C.) | Presence or Absence of Crystal | | | | Hardness (Hv) |
|---|---|---|---|---|---|
| | CBN | WBN | HBN | Amorphous | |
| −150 | O | O | X | O | 3300 |
| −100 | O | O | X | O | 3450 |
| −50 | O | O | X | O | 3540 |
| 0 | O | O | X | O | 3950 |
| 50 | O | O | X | X | 4150 |
| 100 | O | O | X | X | 4950 |
| 200 | O | O | X | X | 4770 |
| 400 | O | O | O | X | 4150 |
| 800 | X | O | O | X | 3100 |
| 1000 | X | X | O | X | 2600 |

Note
O: present
X: absent

EXAMPLE 4

This Example is to prove the presence of the nitrogen atom excited at a low energy level in the atmosphere in the process of the present invention.

Figure 4:
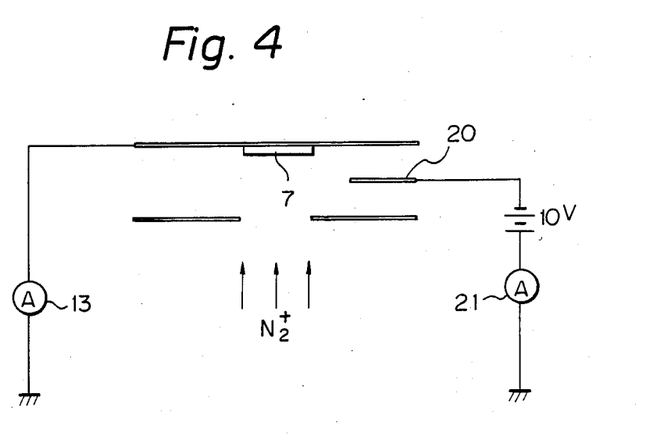
FIG. 4 is a circuit diagram showing a circuit used for measuring the current in Example 4.

As shown in FIG. 4, a metal plate 20 was located at a position not irradiated with $N_2^+$ ions, and the current was measured by a μμA meter 21. The obtained results are shown in Table 3.

TABLE 3

| Acceleration Voltage KV | Current of Substrate μA/cm² | Current of Metal Plate 20 μA/cm² |
|---|---|---|
| 30 | 14 | 0.033 |
| 32 | 15 | 0.040 |
| 34 | 16 | 0.047 |
| 36 | 17 | 0.057 |
| 38 | 20 | 0.067 |
| 40 | 20 | 0.077 |

TABLE 1

| Run No. | B/N | $N_2^+$ Acceleration Voltage V(KV) | Ion Current I(μA/cm²) | Generated Heat Quantity V × I(W/cm²) | Film-Forming Speed Å/min | Electric Resistance Ω · cm | Hardness Hv kg/mm² |
|---|---|---|---|---|---|---|---|
| 1 | 28 | 35 | 15 | 0.525 | 251 | $3.2 \times 10^5$ | 3200 |
| 2 | 22 | 35 | 15 | 0.525 | 182 | $1.0 \times 10^9$ | 3850 |
| 3 | 15 | 35 | 15 | 0.525 | 135 | $1.8 \times 10^{10}$ | 4650 |
| 4 | 10 | 35 | 15 | 0.525 | 99 | $2.1 \times 10^{10}$ | 4850 |
| 5 | 5 | 35 | 15 | 0.525 | 75 | $1.9 \times 10^{10}$ | 4000 |
| 6 | 1 | 35 | 15 | 0.525 | 14 | $2.8 \times 10^{13}$ | 3000 |
| 7 | 0.3 | 35 | 15 | 0.525 | 4 | $1.7 \times 10^{14}$ | 2700 |
| 8 | 10 | 5 | 1 | 0.005 | 8 | $3.0 \times 10^{13}$ | 2650 |
| 9 | 10 | 30 | 10 | 0.300 | 92 | $2.2 \times 10^{10}$ | 4750 |
| 10 | 10 | 40 | 21 | 0.820 | 171 | $1.8 \times 10^{10}$ | 4900 |
| 11 | 10 | 100 | 230 | 23.000 | 1,424 | $1.1 \times 10^{10}$ | 2900 |

EXAMPLE 3

BN films were prepared in the same manner as described in Example 1 except that cermet of the TiC-TiN type was used as the substrate, the ion seed acceleration voltage was changed to 35 KeV (corresponding to the acceleration energy of 17.5 KeV per atom of the ion seed), the atomic ratio B/N was adjusted to 10 and the substrate temperature was changed as shown in Table 2.

With respect to each of the formed films, the identification of the crystal was performed by X-ray diffractometry and the hardness was measured.

The obtained results are shown in table 2.

From the results of the analysis of the residual gas in the reaction chamber, it was confirmed that a nitrogen gas atmosphere was produced in the reaction chamber, and from the above results, it was confirmed that an atmosphere containing activated nitrogen atoms was produced around the substrate.

EXAMPLE 5

High-purity $N_2$ was introduced into a PIG ion source 2 from a gas introduction opening 1 in the apparatus shown in FIG. 2. Various acceleration energies were given to the generated ions. The ion beams were subjected to the mass analysis in an analyzing magnet 4 to magnetically select $N_2^+$ ions alone.

A silicon plate was used as the substrate and was secured to a substrate holder 8, and a reaction chamber 5 was evacuated by a turbo molecule pump having a capacity of 650 l/sec.

Then, nitrogen gas was supplied from an introduction pipe 18 and an arc discharge region was produced by an arc discharge power source 17, whereby boron ions were mainly formed while a boron-nitrogen intermediate product was partially formed. These ions and intermediate product were vacuum-deposited on the substrate 7 simultaneously with irradiation with $N_2^+$ ions. When the gas in the reaction chamber 5 was analyzed at this step, it was found that an activated nitrogen gas atmosphere was produced.

The vacuum-deposited amount and vacuum deposition speed of boron were measured by an oscillating type thickness meter 11 and the number of the $N_2^+$ ions was measured by a current integrating meter 13, and the atomic ratio B/N was calculated.

Thus, films were prepared by changing the ion acceleration energy for $N_2^+$ ions and the vacuum-deposited amount.

A BN film having a thickness of 2.5 μm was prepared by continuing the operation for 2 hours under such conditions that the $N_2^+$ ion acceleration voltage was 35 KV (corresponding to the acceleration energy of 17.5 KeV per atom of the ion seed), the atomic ratio B/N was 10, the substrate temperature was 200° C. and the vacuum degree was $0.8 \times 10^{-5}$ Torr.

Figure 5:
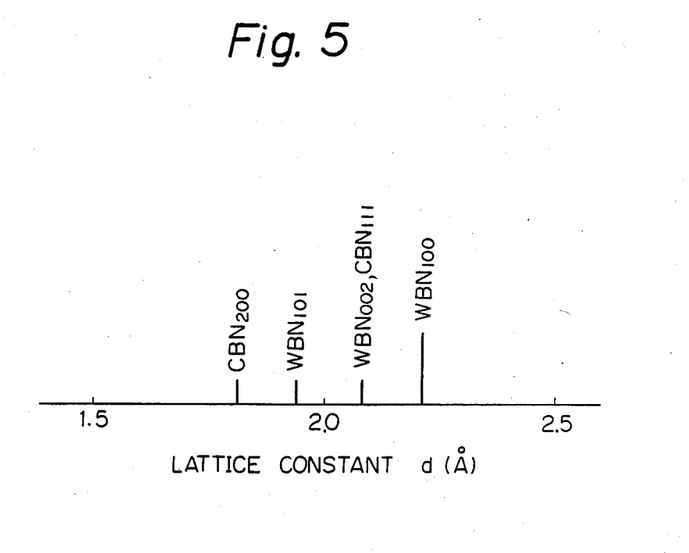
FIG. 5 is a diagram illustrating the relative intensity of a peak to the lattice constant d, determined by X-ray diffractometry of a boron nitride film obtained according to the present invention.

When the obtained BN film was analyzed by X-ray diffractometry, as shown in FIG. 5, peaks of CBN and WBN corresponding to lattice constants d thereof were observed and the relative intensity could be known. When the Vickers hardness of the BN film was measured, such a large value as 7000 Kg/mm² was obtained.

Comparative Example 1

The film-forming operation was carried out for 2 hours in the same manner as described in Example 5 except that a boron-containing vacuum deposition source was arranged instead of the boron arc discharge mechanism, the atomic ratio B/N in the boron and nitrogen atoms supplied from the vacuum deposition source and ion seed was adjusted to 10 and boron was vacuum-deposited by electron beam heating, whereby a BN film having a thickness of 2 μm was obtained.

When the so-obtained BN film was analyzed by X-ray diffractometry, peaks attributed to CBN (111) and WBN (002) were observed. When the Vickers hardness was measured, a value of 5000 Kg/mm² was obtained.

As is seen from the foregoing description, the hardness of the film obtained in Example 5 is much higher than that of the film obtained in Comparative Example 1, and the activating effect by the boron arc discharge is obvious and prominent.

EXAMPLE 6

BN films were prepared in the same manner as in Example 5 except that the atomic ratio B/N, the $N_2^+$ acceleration voltage and the dose rate were changed as shown in Table 4.

The obtained results are shown in Table 4.

TABLE 4

| Run No. | Atomic Ratio B/N | $N_2^+$ Acceleration Voltage V(KV) | Ion Current (μA/cm²) | Quantity of Generated Heat V × I(W/cm²) | Film-Forming Speed (Å/min) | Electric Resistance (Ω · cm) | Hardness HV(kg/mm²) |
|---|---|---|---|---|---|---|---|
| 1 | 30 | 35 | 6.0 | 0.21 | 350 | $4.1 \times 10^5$ | 3050 |
| 2 | 20 | 35 | 5.8 | 0.20 | 320 | $1.8 \times 10^9$ | 3500 |
| 3 | 15 | 35 | 6.4 | 0.22 | 250 | $1.6 \times 10^{10}$ | 5100 |
| 4 | 13 | 35 | 9.3 | 0.33 | 210 | $2.3 \times 10^{10}$ | 6200 |
| 5 | 9 | 35 | 8.7 | 0.30 | 100 | $2.3 \times 10^{10}$ | 6900 |
| 6 | 5 | 35 | 9.1 | 0.32 | 50 | $5.9 \times 10^{10}$ | 5900 |
| 7 | 3 | 35 | 9.4 | 0.33 | 15 | $2.0 \times 10^{11}$ | 3100 |
| 8 | 1.5 | 35 | 9.9 | 0.35 | 5 | $7.0 \times 10^{13}$ | 3000 |
| 9 | 10 | 35 | 0.2 | 0.007 | 10 | $3.0 \times 10^{12}$ | 3300 |
| 10 | 9 | 50 | 450.0 | 22.0 | 900 | measurement impossible | measurement impossible |
| 11 | 8 | 8 | 37.5 | 0.30 | 800 | $3.9 \times 10^{12}$ | 3000 |
| 12 | 11 | 210 | 1.4 | 0.28 | 10 | measurement impossible | measurement impossible |

In Table 4, the $N_2^+$ acceleration voltage V (KV) corresponds to 2 times the acceleration energy (KeV) per atom of the ion seed.

From the results shown in Table 4, it is seen that in Runs Nos. 2 through 6 and 9, since the $N_2^+$ acceleration voltage and the atomic ratio B/N are within the ranges specified in the present invention, films excellent in the hardness are obtained, and films obtained in Runs Nos. 3 through 6 have an especially excellent hardness.

In Runs Nos. 9 and 10, even though the $N_2^+$ acceleration voltage and the atomic ratio B/N are within the ranges specified in the present invention, the quantity of heat generated in the substrate by the ion seed irradiation is outside the range specified in the present invention. Accordingly, though the hardness is somewhat improved in Run No. 9, the film obtained in Run No. 10 is rendered porous since the quantity of generated heat is extremely large and evaporation is caused. Therefore, the measurement of the electric resistance or hardness is impossible in this sample.

In Runs Nos. 11 and 12, since the $N_2^+$ acceleration voltage is outside the range specified in the present invention, an excellent hardness is not obtained in Run No. 11, and swelling is caused in Run No. 12 because of an excessive acceleration voltage and the film is rendered porous, with the result that the measurement of the electric resistance or the hardness is impossible. In Runs Nos. 1, 7 and 8 even though an improvement of the hardness is expected by implantation of ions, since the atomic ratio B/N is outside the range specified in the present invention, an excellent hardness cannot be obtained.

EXAMPLE 7

This Example is to illustrate the relation between the atomic ratio B/N calculated from the preparation conditions and the actual atomic ratio B/N in the formed film.

BN films were formed on an Au foil having a thickness of 8000 Å while changing the atomic ratio B/N within a range of from 2.5 to 11, and with respect to each of the obtained BN films, the atomic ratio B/N was determined by the quantitative analysis using high-speed ions. The obtained results are shown in FIG. 6.

In the analysis of the atomic ratio B/N in the BN film, the hydrogen ion acceleration energy was 2 MeV, the angle of a semiconductor detector was 165° and the gain was 300, and the atomic ratio was determined from the formation spectrum of back-scattered ions. In this formation spectrum, the composition ratio of B and N was determined from the peak ratio of $B_{11}$ and $N_{14}$ (11 and 14 indicate the atom numbers).

Figure 6:
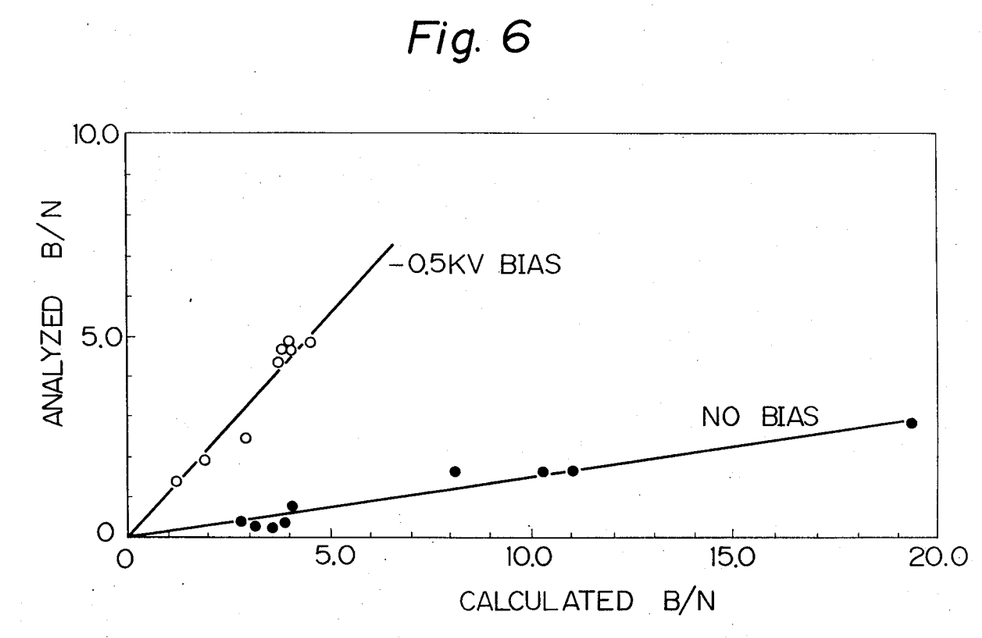
FIG. 6 is a graph showing the relation between the B/N atomic ratio calculated from the preparation conditions set by the present invention and the actual B/N atomic ratio in the obtained BN film.

In FIG. 6, the actual atomic ratio B/N of the BN film determined from the peak ratio in the formation spectrum is plotted by marks relatively to the atomic ratio B/N calculated from the preparation conditions in the case where no bias voltage was applied, and the actual atomic ratio B/N of the BN film determined from the peak ratio in the formation spectrum is plotted by marks O relatively to the atomic ratio B/N calculated from the preparation conditions in the case where a bias voltage of $-0.5$ KV was applied.

From the results shown in FIG. 6, it is seen that it is when the atomic ratio B/N calculated from the preparation conditions is about 10 that the atomic ratio B/N in the film is ideally 1, and this supports that the nitrogen component is supplementarily supplied from the nitrogen gas of a low energy level present around the substrate.

It also is seen that when a negative bias voltage is applied, nitrogen ions of a low energy level present around the substrate are attracted to the substrate, the effects of the present invention are enhanced.

As is apparent from the foregoing description, according to the process of the present invention, by vacuum-depositing boron activated by the arc discharge on the substrate, the film-forming speed can be optionally controlled, and a high-quality BN film composed mainly of CBN and WBN can be continuously prepared at a high speed.

EXAMPLE 8

High-purity $N_2$ gas was introduced into a PIG ion source 2 from a leak valve 1 in the apparatus shown in FIG. 3.

Various acceleration energy were given to generated ions by an accelerator 3. The ion beams were subjected to the mass analysis by an analyzing magnet 4 to magnetically select $N_2^+$ ions alone.

A silicon plate was used as the substrate and was secured to a substrate holder 8, and a reaction chamber 5 was evacuated by a turbo molecule pump having a capacity of 650 l/sec.

A negative bias voltage was applied to the substrate 7 from a bias power source 19, and an electron beam vacuum deposition device 10 containing metallic boron therein was actuated to evaporate metallic boron and the vapor of boron was deposited on the substrate 7 while simultaneously irradiating the substrate 7 with $N_2^+$ ions. The gas in the reaction chamber 5 at this step was analyzed, and it was found that an activated nitrogen gas atmosphere was produced in the reaction chamber 5.

The vacuum deposited quantity and vacuum deposition speed of B were measured by an oscillating type thickness meter 11 and the number of $N_2^+$ ions was measured by a current integrating meter 13, and the atomic ratio B/N was calculated.

Films were prepared by changing the amount deposited of B by changing the ion acceleration energy for $N_2^+$ ions while changing the bias voltage.

A BN film having a thickness of 2.5 $\mu$m was prepared by continuing the operation for 2 hours under such conditions that the $N_2^+$ ion acceleration energy was 35 KeV, the atomic ratio B/N was 1.5, the bias voltage was $-1$ KV, the substrate temperature was 200° C. and the vacuum degree was $0.8 \times 10^{-5}$ Torr.

When the obtained BN film was analyzed by X-ray diffractometry, it was found that peaks attributed to CBN (111) and WBN (002) appeared, and the presence of CBN and WBN was confirmed. When the Vickers hardness of the BN film was measured, such a large value as 6900 kg/mm$^2$ was obtained.

Comparative Example 2

A BN film having a thickness of 2 $\mu$m was prepared by continuing the operation for 2 hours in the same manner as described in Example 8 except that no bias voltage was applied to the substrate and the atomic ratio B/N was set at 10.

When the obtained BN film was analyzed by X-ray diffractometry, peaks attributed to CBN (111) and WBN (002) were observed. When the Vickers hardness was measured, a value of 4850 kg/mm$^2$ was obtained.

In this Comparative Example, no amount of the nitrogen component supplied from the atmosphere was included in calculating the atomic ratio B/N but only the amount of the nitrogen component supplied from the irradiated ions was taken in calculating the atomic ratio B/N. On the other hand in Example 8, the ion seed activated to a low energy level in the atmosphere was added to the amount of irradiated ions, and therefore, the ion current was 5 to 6 times the ion current in Comparative Example 2 and the amount of the nitrogen component participating actually in the reaction was increased. Accordingly, even though a BN film composed mainly of CBN or WBN is similarly prepared by the same reaction in Example 8 and Comparative Example 2, the parameter of the atomic ratio B/N is 1.5 in the former while this parameter is 10 in the latter. This difference indicates that according to the process of the present invention, an atmosphere activated to a low energy level is caused to participate positively in formation of a BN film, whereby the quality and hardness of the BN film can be highly improved.

EXAMPLE 9

In this Example, the influences of the atomic ratio B/N were examined by changing this atomic ratio (a bias voltage of $-1.0$ KV was applied).

More specifically, in Runs Nos. 1 through 8, BN films were prepared in the same manner as described in Example 8 except that the atomic ratio BV/N was changed as shown in Table 5.

The obtained results are shown in Table 5.

TABLE 5

| Run No. | B/N | $N_2^+$ Acceleration Voltage V(KV) | Ion Current I ($\mu A/cm^2$) | Film-Forming Speed Å/min | Electric Resistance $\Omega \cdot cm$ | Hardness HV(Kg/cmm$^2$) |
|---|---|---|---|---|---|---|
| 1 | 12 | 35 | 62 | 340 | $4.0 \times 10^5$ | 3150 |
| 2 | 8 | 35 | 57 | 310 | $1.9 \times 10^9$ | 3400 |
| 3 | 4 | 35 | 63 | 250 | $1.7 \times 10^{10}$ | 5050 |
| 4 | 2 | 35 | 92 | 200 | $2.1 \times 10^{10}$ | 6100 |
| 5 | 1 | 35 | 87 | 90 | $2.3 \times 10^{10}$ | 6800 |
| 6 | 0.7 | 35 | 91 | 20 | $5.6 \times 10^{10}$ | 6300 |
| 7 | 0.5 | 35 | 93 | 8 | $1.7 \times 10^{14}$ | 4800 |
| 8 | 0.1 | 35 | 98 | 5 | $2.1 \times 10^{14}$ | 3000 |

From the results shown in Table 5, it is seen that if the atomic ratio B/N exceeds 10, the electric resistance and hardness are reduced and that if the atomic ratio B/N is lower than 0.2, formation of HBN becomes conspicuous and the hardness is reduced.

EXAMPLE 10

In this Example, influences of application of a bias voltage on the ion current were examined.

Changes of the ion current were examined by changing the $N_2^+$ ion acceleration voltage within a range of 25 to 40 KV while applying no bias voltage in Runs Nos. 1 through 4 or applying a bias voltage of $-1.0$ KV in runs Nos. 5 through 8. The obtained results are shown in Table 6.

From the results shown in Table 6, it is seen that if a negative bias voltage is applied, the ion current is increased to a level about 5 times the iron current obtained when no bias voltage is applied. Accordingly, it is seen that the film-forming speed is increased by applying a negative bias voltage.

TABLE 6

| Run No. | $N_2^+$ Acceleration Voltage V(KV) | Ion Current I($\mu A/cm^2$) | Bias Voltage VB(KV) |
|---|---|---|---|
| 1 | 25 | 10 | 0 |
| 2 | 30 | 15 | 0 |
| 3 | 35 | 18 | 0 |
| 4 | 40 | 22 | 0 |
| 5 | 25 | 49 | $-1.0$ |
| 6 | 30 | 55 | $-1.0$ |
| 7 | 35 | 90 | $-1.0$ |
| 8 | 40 | 120 | $-1.0$ |

EXAMPLE 11

In this Example, influences of the temperature were examined.

BN films were prepared in the same manner as described in Example 8 except that cermet of the TiC-TiN type was used as the substrate, the ion seed acceleration energy was adjusted to 35 KeV, the bias voltage was set at $-1.0$ KV, the atomic ratio B/N was adjusted 1.5 and the substrate temperature was changed as indicated in Table 7. The obtained results are shown in Table 7.

TABLE 7

| Substrate Temperature °C. | Presence or Absence of Crystal | | | | Hardness Hv (kg/mm$^2$) |
|---|---|---|---|---|---|
| | CBN | WBN | HBN | amorphous | |
| $-150$ | O | O | X | O | 3400 |
| $-100$ | O | O | X | O | 3550 |
| $-50$ | O | O | X | O | 3940 |
| 0 | O | O | X | O | 5000 |
| 50 | O | O | X | O | 5350 |
| 100 | O | O | X | O | 6450 |
| 200 | O | O | X | X | 6800 |
| 400 | O | O | O | X | 5100 |
| 800 | X | O | O | X | 3200 |
| 1000 | X | X | O | X | 2900 |

Note
O: present
X: absent

EXAMPLE 12

A BN film was prepared in the same manner as described in Example 8 except that high-purity $H_2$ gas having a purity of 99.995%, an oxygen concentration lower than 1 ppm and a carbon gas concentration of 2 ppm was used as the starting $N_2$ gas and metallic boron having a purity of 99.995% was used as the starting metallic boron and the vacuum degree at the film-forming operation was adjusted to $4 \times 10^{-6}$ Torr.

During formation of the BN film, the oxygen concentration and carbon concentration were measured by a mass analyzer. It was found that the oxygen concentration was 2 ppm and carbon was not substantially detected.

When the obtained BN film was analyzed by X-ray diffractometry, the peaks attributed to CBN (111) and WBN (002) were observed and the presence of CBN and WBN was confirmed. When the Vickers hardness of the film was measured, such a large value as 7200 kg/mm$^2$ was obtained.

The above procedures were repeated in the same manner except that the vacuum degree and the purities of the starting $N_2$ gas and B were changed as shown in Table 8.

The obtained results are shown in table 8.

TABLE 8

| Run No. | Vacuum Degree (Torr) | Purity of $N_2$ Gas (%) | Purity of B (%) | Concentration in Atmosphere (ppm) | | Hardness Hv(kg/mm$^2$) |
|---|---|---|---|---|---|---|
| | | | | oxygen atom | carbon atom | |
| 1 | $4 \times 10^{-6}$ | 99.9995 | 99.999 | 5 | 1 | 7200 |
| 2 | $0.8 \times 10^{-5}$ | 99.995 | 99.99 | 40 | 30 | 6400 |
| 3 | $0.8 \times 10^{-5}$ | 99.995 | 99.999 | 50 | 20 | 6300 |
| 4 | $0.8 \times 10^{-5}$ | 99.9995 | 99.999 | 30 | 20 | 6500 |
| 5 | $0.8 \times 10^{-5}$ | 99.99 | 99.99 | 80 | 40 | 5000 |

EXAMPLE 13

In forming BN films in the same manner as described in Example 12, the amounts of oxygen and nitrogen atoms contained in the reaction chamber were set as shown in Table 9 by making oxygen gas, carbon monoxide or carbon dioxide gas present in the reaction chamber. Incidentally, the gas concentrations were calculated from the partial pressures of the gases present in the reaction chamber.

In each of the obtained BN films, the presence or absence of CBN or WBN was checked by X-ray diffractometry, and the Vickers hardness of each film was measured.

The obtained results are shown in Table 9.

TABLE 9

| Run No. | Oxygen Concentration (ppm) | Carbon Concentration (ppm) | Presence or Absence of CBN or WBN | Vickers Hardness Hv(kg/mm$^2$) |
|---|---|---|---|---|
| 1 | 5 | 0 | O | 6800 |
| 2 | 10 | 0 | O | 6600 |
| 3 | 4 | 12 | O | 6400 |
| 4 | 10 | 20 | O | 6300 |
| 5 | 23 | 23 | O | 6200 |
| 6 | 81 | 0 | O | 5000 |
| 7 | 54 | 54 | Δ | 4400 |
| 8 | 138 | 0 | Δ | 3800 |
| 9 | 64 | 128 | Δ | 3100 |
| 10 | 410 | 0 | X | 2200 |
| 11 | 220 | 220 | X | 2000 |

Note
O: presence of CBN and WBN was confirmed but HBN was not present and amorphous phase was partially included
Δ: HBN was formed together with CBN and WBN
X: CBN or WBN was not formed From the results shown in Table 9, it is seen that according to Runs Nos. 1 through 6 of the present invention, HBN is not formed and high-quality BN films composed mainly of CBN and WBN are obtained. It also is seen that the hardness is reduced with increase of the oxygen and carbon concentrations.

We claim:

1. A process for the production of a high-hardness boron nitride film, which comprises vacuum-depositing a boron component on a substrate from a boron-containing vacuum deposition source and simultaneously irradiating the substrate with an ion seed comprising at least nitrogen from an ion-generating source for generating said ion seed, to form boron nitride on the substrate, wherein the atomic ratio (B/N) between boron and nitrogen supplied from the vacuum deposition source and the ion seed is adjusted within a range of from 4 to 25, the ion acceleration energy of the ion seed is adjusted to 5 to 100 KeV per atom of the ion seed, and vacuum deposition and irradiation are carried out in an atmosphere of a nitrogen atom or nitrogen compound activated at an energy level lower than that of the ion seed.

2. A process according to claim 1, wherein the temperature of the substrate is maintained at −200° to 700° C.

3. A process according to claim 1, wherein the irradiation with the ion seed is carried out so that the quantity of heat generated in the substrate by the irradiation with the ion seed is 0.01 to 20 W/cm$^2$.

4. A process according to claim 1, wherein the boron-containing vacuum deposition source is metallic boron.

5. A process according to claim 1, wherein the nitrogen-containing ion seed is one obtained by ionization and acceleration of a nitrogen gas.

6. A process according to claim 1, wherein the atmosphere of the nitrogen atoms or nitrogen compound activated at an energy level lower than that of the ion seed is one formed by generating arc discharge in a current of a nitrogen gas or a nitrogen compound.

7. A process according to claim 1, wherein the atmosphere of the nitrogen atom or nitrogen compound activated at an energy level lower than that of the ion seed is supplied together with the high-energy ion seed from the ion-generating source.

8. A process according to claim 1, wherein the total concentration of oxygen and carbon atoms in the atmosphere adopted for the vacuum deposition and ion seed irradiation is controlled below 100 ppm.

9. A process according to claim 1, wherein activated boron is vacuum-deposited on the substrate by supplying a boron-containing gas to an arc discharge region.

10. A process according to claim 1, wherein a boron-containing substance is used as an arc discharge electrode material to provide an arc discharge region, and activated boron is vacuum-deposited on the substrate.

11. A process for the production of a high-hardness boron nitride film, which comprises vacuum-depositing on a substrate activated boron formed by generating an arc discharge region by using a boron-containing substance as an arc discharge electrode material, and simultaneously irradiating the substrate with an ion seed comprising at least nitrogen from an ion-generating source for generating said ion seed, to form boron nitride on the substrate, wherein the ion acceleration energy of the ion seed is adjusted to 5 to 100 KeV per atom of the ion seed, at least one member selected from nitrogen gas, nitrogen compound gases and inert gases is supplied to the arc discharge region, and a nitrogen atom or nitrogen compound activated at an energy level lower than that of the ion seed is formed in the atmosphere.

12. A process for the production of a high-hardness BN film, which comprises vacuum-depositing a boron component on a substrate from a boron-containing vacuum deposition source and simultaneously irradiating the substrate with an ion seed comprising at least nitrogen from an ion-generating source for generating said ion seed, to form BN on the substrate, wherein the ion acceleration energy of the ion seed is adjusted to 5 to 100 KeV per atom of the ion seed, vacuum deposition and irradiation are carried out in an atmosphere of a nitrogen atom or nitrogen compound activated at an energy level lower than that of the ion seed, and simultaneously, a negative bias voltage is applied to the substrate.

13. A process according to claim 12, wherein the atomic ratio B/N in boron and nitrogen atoms supplied from the vacuum deposition source and in seed is adjusted within a range of from 0.2 to 10.

14. A process according to claim 12, wherein the temperature of the substrate is maintained at −200° to 700° C.

15. A process according to claim 12, wherein the irradiation with the ion seed is carried out so that the quantity of heat generated in the substrate by the irradiation with the ion seed is 0.01 to 20 W/cm$^2$.

16. A process according to claim 12, wherein the bias voltage is within a range of from −100 V to −10 V.

17. A process according to claim 12, wherein the total concentration of oxygen and carbon atoms in the atmosphere adopted for the vacuum deposition and irradiation with the ion seed is controlled below 100 ppm.

18. A process for the production of a high-hardness boron nitride film on a substrate which comprises
   (i) placing a substrate into a reaction chamber maintained in a vacuum less than $10^{-4}$ torr,
   (ii) maintaining the substrate at a temperature of 0° to 400° C.,
   (iii) heating a boron-containing vacuum deposition source contained in the reaction chamber to vaporize the source, said source being selected from the group consisting of metallic boron and boron compounds,
   (iv) introducing a gas selected from the group consisting of nitrogen and nitrogen compounds into an ion source to ionize gas and form an ion seed comprising at least nitrogen,
   (v) accelerating the ion seed by an accelerator so that the ion seed has the ion acceleration energy of from 5 to 100 KeV per nitrogen atom of the ion seed,
   (vi) forming an atmosphere of a nitrogen atom or nitrogen compound activated at an energy level lower than that of the ion seed in the reaction chamber, and
   (vii) vacuum-depositing a boron component on the substrate from the vaporized source and simultaneously irradiating the substrate with the ion seed while maintaining the atomic ratio (B/N) between boron and nitrogen supplied from the vaporized source and the ion seed within a range of from 4 to 25.

19. A process for the production of a high-hardness boron nitride film on a substrate which comprises
   (i) placing a substrate into a reaction chamber maintained in a vacuum less than $10^{-4}$ torr,
   (ii) maintaining the substrate at a temperature of 0° to 400° C.,
   (iii) supplying a boron-containing gas to an arc discharge region in the reaction chamber to ionize a part of boron,
   (iv) introducing a gas selected from the group consisting of nitrogen and nitrogen compounds into an ion source to ionize gas and form an ion seed comprising at least nitrogen,
   (v) accelerating the ion seed by an accelerator so that the ion seed has the ion acceleration energy of from 5 to 100 KeV per nitrogen atom of the ion seed,
   (vi) supplying nitrogen gas or a nitrogen compound gas to the arc discharge region to form an atmosphere of a nitrogen atom or nitrogen compound activated at an energy level lower than that of the ion seed in the reaction chamber, and
   (vii) vacuum-depositing a boron component on the substrate from the activated boron containing gas and simultaneously irradiating the substrate with the ion seed in said atmosphere while maintaining the atomic ratio (B/N) between boron and nitrogen supplied from the vacuum deposition source and the ion seed within a range of from 4 to 25.

20. A process for the production of a high-hardness boron nitride film on a substrate which comprises
   (i) placing a substrate into a reaction chamber maintained in a vacuum less than $10^{-4}$ torr,
   (ii) maintaining the substrate at a temperature of 0° to 400° C.,
   (iii) causing arc discharge between double electrodes comprising a boron containing material while introducing nitrogen gas or nitrogen compound gas into the arc discharge region to form a nitrogen-containing boron ion,
   (iv) introducing a gas selected from the group consisting of nitrogen and nitrogen compounds into an ion source to ionize gas and form an ion seed comprising at least nitrogen,
   (v) accelerating the ion seed by an accelerator so that the ion seed has the ion acceleration energy of from 5 to 100 KeV per nitrogen atom of the ion seed, and
   (vi) vacuum-depositing a boron component on the substrate from the nitrogen-containing boron ion and simultaneously irradiating the substrate with the ion seed while maintaining the atomic ratio (B/N) between boron and nitrogen supplied from the vacuum deposition source and the ion seed within a range of 4 to 25.

21. A process for the production of a high-hardness boron nitride film on a substrate which comprises
   (i) placing a substrate into a reaction chamber maintained in a vacuum less than $10^{-4}$ torr,
   (ii) maintaining the substrate at a temperature of 0° to 400° C.,
   (iii) heating a boron-containing vacuum deposition source contained in the reaction chamber to vaporize the source, said source being selected from the group consisting of metallic boron and boron compounds,
   (iv) introducing a gas selected from the group consisting of nitrogen and nitrogen compounds into an ion source to ionize gas and form an ion seed comprising at least nitrogen,
   (v) accelerating the ion seed by an accelerator so that the ion seed has the ion acceleration energy of from 5 to 100 KeV per nitrogen atom of the ion seed,
   (vi) forming an atmosphere of a nitrogen atom or nitrogen compound activated at an energy level lower than that of the ion seed in the reaction chamber,
   (vii) applying a negative bias voltage within a range of from $-100$ Volt to $-10$ KV to the substrate, and
   (viii) vacuum-depositing a boron component on the substrate from the vaporized source and simultaneously irradiating the substrate with the ion seed while maintaining the atomic ratio (B/N) between boron and nitrogen supplied from the vacuum deposition source and the ion seed within a range of from 0.2 to 10.

* * * * *